United States Patent
Choi et al.

(10) Patent No.: US 8,110,873 B2
(45) Date of Patent: Feb. 7, 2012

(54) HIGH VOLTAGE TRANSISTOR

(75) Inventors: Sung-Gon Choi, Osan-si (KR); Hee-Seog Jeon, Suwon-si (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 452 days.

(21) Appl. No.: 12/339,448

(22) Filed: Dec. 19, 2008

(65) Prior Publication Data

US 2009/0194815 A1  Aug. 6, 2009

(30) Foreign Application Priority Data

Dec. 20, 2007  (KR) ............ 10-2007-134337

(51) Int. Cl.
*H01L 21/76* (2006.01)
(52) U.S. Cl. ............ 257/338; 257/339; 257/E29.226
(58) Field of Classification Search ........... 257/338–339
See application file for complete search history.

(56) References Cited

U.S. PATENT DOCUMENTS

| 5,894,150 | A | * | 4/1999 | Hshieh | 257/335 |
| 7,754,564 | B2 | * | 7/2010 | Fenigstein et al. | 438/257 |
| 2005/0035404 | A1 | | 2/2005 | Yu et al. | |
| 2006/0065928 | A1 | * | 3/2006 | Nagai | 257/344 |

FOREIGN PATENT DOCUMENTS

| JP | 2005-064508 | 3/2005 |
| JP | 2006-100404 | 4/2006 |
| JP | 2007-027622 | 2/2007 |
| KR | 10-2004-0071793 | 8/2004 |
| KR | 10-2005-0017861 | 2/2005 |

* cited by examiner

*Primary Examiner* — Thanh Nguyen
(74) *Attorney, Agent, or Firm* — Stanzione & Kim, LLP (57) ABSTRACT

A high voltage transistor that includes a substrate where an active region is defined, a first impurity region and a second impurity region in the active region and a third impurity region between the first and second impurity regions, and a first gate electrode on the active region between the first impurity region and the third impurity region and a second gate electrode on the active region between the second impurity region and the third impurity region.

18 Claims, 5 Drawing Sheets

HIGH VOLTAGE TRANSISTOR

CROSS-REFERENCE TO RELATED APPLICATIONS

This U.S. non-provisional patent application claims priority under 35 U.S.C. §119 of Korean Patent Application No. 10-2007-0134337, filed on Dec. 20, 2007, the entire contents of which are hereby incorporated by reference.

BACKGROUND

1. Field of the Invention

The present general inventive concept disclosed herein relates to a semiconductor device, and more particularly, to a semiconductor device including a high voltage transistor.

A semiconductor device may include various transistors, such as a high voltage transistor and a low voltage transistor. In the high voltage transistor, as a high electric field is formed at the edge of its gate electrode during an operating process, there is a limitation in that a breakdown voltage becomes lower. Additionally, there is a limitation in that a breakdown voltage becomes lower by a high electric field formed between the edges of a contact plug and a gate electrode. Accordingly, in order to raise a breakdown voltage, source and drain regions of the high voltage transistor typically have a double diffused drain (DDD) structure in which a low concentration impurity region surrounds a high concentration impurity region. Moreover, in order to reduce a contact resistance between a contact plug and a source/drain region, it is required to form a silicide layer on the source/drain region. However, if the silicide layer is formed on the high and low concentration regions, the effect of the DDD structure for raising a breakdown voltage can be decreased. If the silicide layer is not formed to raise a breakdown voltage of the high voltage transistor, a contact resistance is increased. Therefore, operating characteristics of the high voltage transistor can be deteriorated. Moreover, there is a limitation in raising a breakdown voltage of the high voltage transistor by only using the DDD structure.

SUMMARY

The present general inventive concept provides a high voltage transistor having a raised threshold voltage.

The present general inventive concept also provides a high voltage transistor having improved operating characteristics.

Additional aspects and utilities of the present general inventive concept will be set forth in part in the description which follows and, in part, will be obvious from the description, or may be learned by practice of the general inventive concept.

Embodiments of the present general inventive concept provide high voltage transistors including: a substrate where an active region is defined; a first impurity region and a second impurity region in the active region and a third impurity region between the first and second impurity regions; and a first gate electrode on the active region between the first impurity region and the third impurity region and a second gate electrode on the active region between the second impurity region and the third impurity region.

In some embodiments, the second gate electrode and the second impurity region may be electrically connected to each other.

In other embodiments, the first impurity region may include a first low concentration region and a first high concentration region in the first low concentration region, and the second impurity region may include a second low concentration region and a second high concentration region in the second low concentration region.

In still other embodiments, the third impurity region may be a low concentration region as the same as the first and second low concentration regions.

In even other embodiments, the high voltage transistors further may include: an interlayer insulation layer covering the first and second gate electrode on the substrate; a first contact connected electrically to the first impurity region through the interlayer insulation layer; a second contact connected electrically to the second impurity region through the interlayer insulation layer; a third contact connected electrically to the second gate electrode through the interlayer insulation layer; and a conductive pattern connected electrically to the second and third contacts on the interlayer insulation layer.

In yet other embodiments, a signal voltage may be simultaneously provided to the second impurity region and the second gate electrode through the conductive pattern.

In further embodiments, the second low concentration region and the third impurity region may be electrically connected to each other through the signal voltage such that an extended low concentration region is formed in the active region between the first gate electrode and the second impurity region.

In still further embodiments, the high voltage transistor may further include a silicide layer on the first impurity region, the second impurity region, the first gate electrode, and the second gate electrode.

In even further embodiments, the high voltage transistors may further include first spacers on both sidewalls of the first gate electrode and second spacers on both sidewalls of the second gate electrode In yet further embodiments, the first spacer and the second spacer are connected to each other between the first and second gate electrodes.

In yet further embodiments, the first spacer and the second spacer between the first and second gate electrodes completely cover the third impurity region between the first and second gate electrodes.

In yet further embodiments, a signal voltage is provided to the second gate electrode, and the second low concentration region and the third impurity region are electrically connected to each other through the signal voltage such that an extended low concentration impurity region is formed in the active region between the first gate electrode and the second impurity region.

Embodiments of the present general inventive concept may also provide a semiconductor device including a high voltage transistor, including a substrate including an active region; a first gate electrode and a second gate electrode disposed over the active region and separated by spacers; a first impurity region having a double diffused drain (DDD) structure disposed in the active region below the first gate electrode, a second impurity region having a double diffused drain (DDD) structure disposed in the active region below the first gate electrode and a third impurity region having a low concentration disposed in the active region between the first and second gate electrodes such that first and second channels are formed below the first and second gate electrodes, respectively; and an electrical contact connecting the second impurity region with the second gate electrode such that a low concentrate region of the second impurity region and the third impurity region become one extended low concentration region when a signal voltage is applied to the electrical contact.

Embodiments of the present general inventive concept may also provide a method of forming a high voltage transistor of a semiconductor device, including forming an isolation layer defining an active region in a substrate; sequentially forming an insulation layer and a conductive layer on the substrate; patterning the insulation layer and the conductive layer to form first and second gate insulation layer and first and second gate electrodes, respectively, the first and second gate electrodes formed to cross over the action region; forming a first low concentration region, a second low concentration region and a third concentration region in the active region; forming first spacers on sidewalls of the first gate electrode and second spacers on sidewalls of the second gate electrode such that the first and second spacers are connected between the first and second gate electrode; forming a first high concentration region in the first low concentration region and a second high concentration region in the second low concentration region using the first and second gates and first and second spacers as ion implantation masks; forming a silicide layer on the first and second gate electrodes and the first and second high concentration regions; forming an insulation layer on the substrate; forming a first contact through the insulation layer to electrically connect with the first impurity region, a second contact through the insulation layer to electrically connect with the second impurity region and a third contact through the insulation layer to electrically connect with the second gate electrode; and forming a first wiring to be electrically connected to the first contact and the second wiring to be electrically connected between the second and third contacts.

BRIEF DESCRIPTION OF THE DRAWINGS

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION OF THE EXEMPLARY EMBODIMENTS

Preferred embodiments of the present general inventive concept will be described below in more detail with reference to the accompanying drawings. The present general inventive concept may, however, be embodied in different forms and should not be construed as limited to the embodiments set forth herein. Rather, these embodiments are provided so that this disclosure will be thorough and complete, and will fully convey the scope of the present general inventive concept to those skilled in the art.

In the figures, the dimensions of layers and regions are exaggerated for clarity of illustration. It will also be understood that when a layer (or film) is referred to as being 'on' another layer or substrate, it can be directly on the other layer or substrate, or intervening layers may also be present. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present. Like reference numerals refer to like elements throughout.

Figure 1:
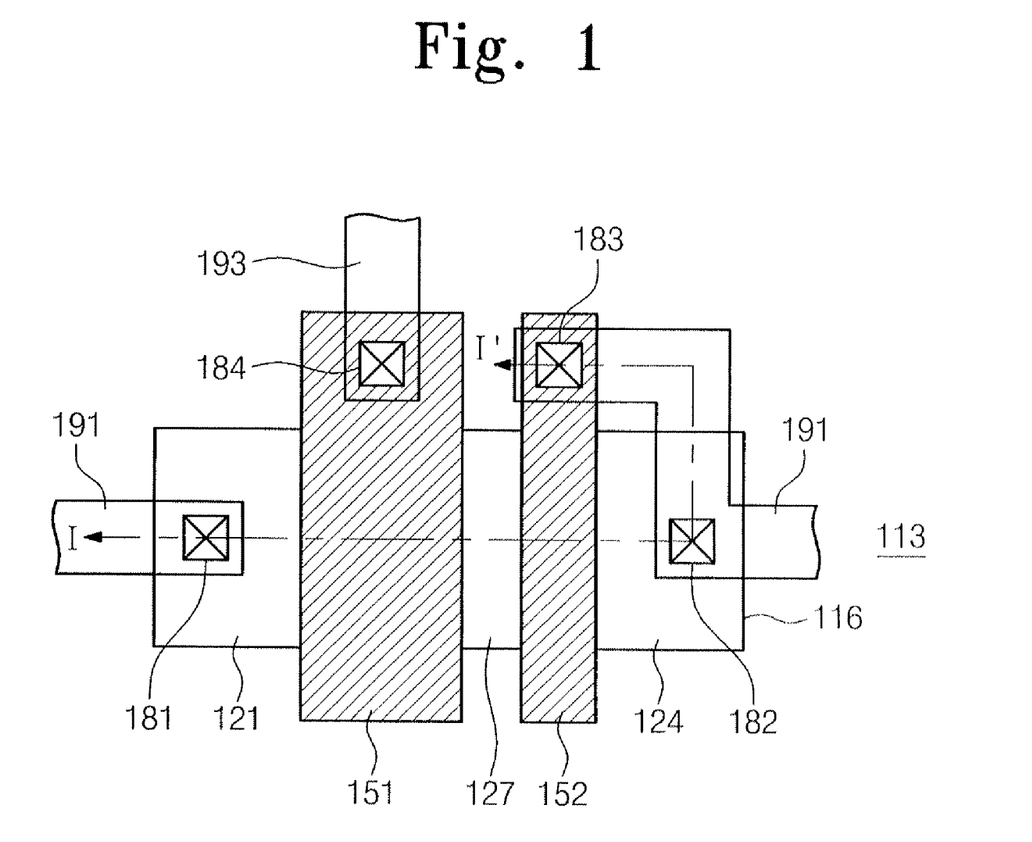
FIG. 1 is a plan view of a high voltage transistor according to an embodiment of the present general inventive concept.
Figure 2A:
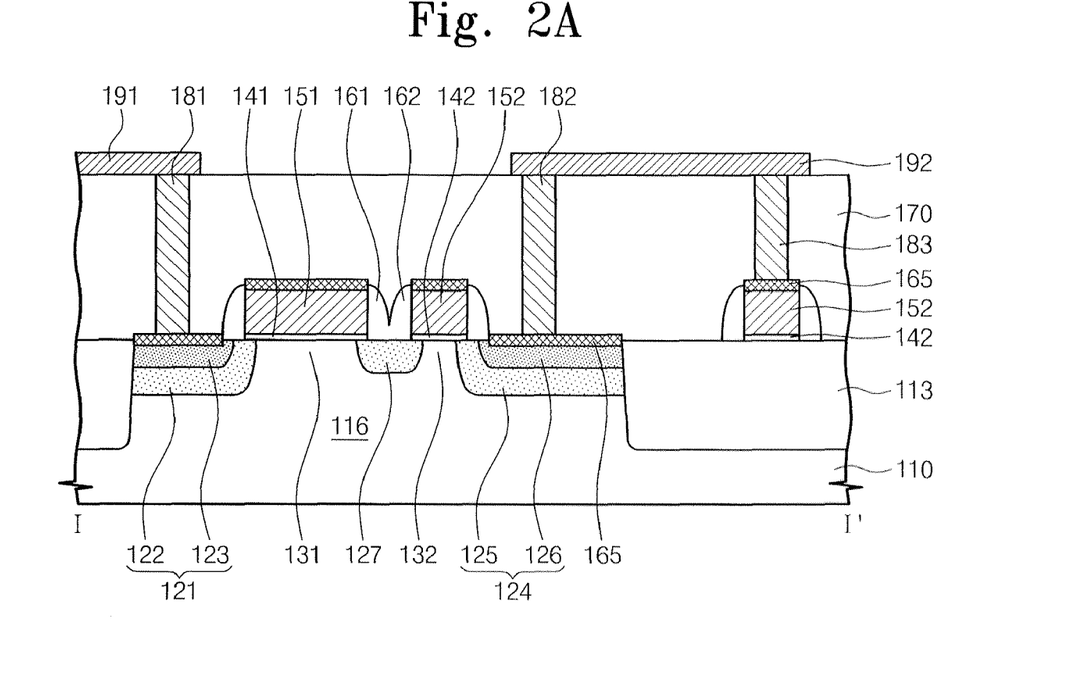
FIGS. 2A and 2B are cross sectional views taken along a line I-I' of FIG. 1 illustrating a high voltage transistor according to an embodiment of the present general inventive concept.

Referring to FIGS. 1 and 2A, an active region 116 is defined by an isolation layer 113 formed in a substrate 110. First and second gate electrodes 151 and 152 are disposed on the active region 116. First and second gate insulation layers 141 and 142 are respectively interposed between the first and second gate electrodes 151 and 152 and the active region 116.

First to third impurity regions 121, 124, and 127 are disposed in the active region 116. The first impurity region 121 includes a first low concentration region 122 and a first high concentration region 123. The second impurity region 124 includes a second low concentration region 125 and a second high concentration region 126. The first and second impurity regions 121 and 124 may have a double diffused drain (DDD) structure. The DDD structure may have a low concentration region and a high concentration region, which is surrounded by the low concentration region. That is, the first low concentration region 122 may surround the first high concentration region 123, and the second low concentration region 125 may surround the second high concentration region 126. The first impurity region 121 may be a source region and the second impurity region 124 may be a drain region. The third impurity region 127 may be disposed between the first impurity region 121 and the second impurity region 124. The third impurity region 127 may have the same low concentration region as the concentration of the first and second low concentration regions 122 and 125.

The active region 116 between the first impurity region 121 and the third impurity region 127 may be defined as a first channel region 131, and the active region 116 between the second impurity region 124 and the third impurity region 127 may be defined as the second channel region 132.

The first gate insulation layer 141 and the first gate electrode 151 are disposed on the first channel region 131, and the second gate insulation layer 142 and the second gate electrode 152 are disposed on the second channel region 132. The first and second gate insulation layers 141 and 142, for example, may be a thermal oxide layer or a chemical vapor deposition (CVD) oxide layer. The first and second gate electrodes 151 and 152 may include a conductive material, such as, for example, a doped polysilicon material.

First and second spacers 161 and 162 are respectively disposed on both sides of each of the first and second gate electrodes 151 and 152. The first spacer 161 and the second spacer 162 may be connected to each other between the first gate electrode 151 and the second gate electrode 152. Additionally, the first and second spacers 161 and 162 between the first and second gate electrodes 151 and 152 may completely cover the third impurity region 127 between the first and second gate electrodes 151 and 152.

A silicide layer 165 is disposed on the first and second high concentration regions 123 and 126 and the first and second gate electrodes 151 and 152. The silicide layer 165 may include tungsten silicide, nickel silicide, cobalt silicide, or titanium silicide.

An interlayer insulation layer 170 is disposed on the substrate 110. The interlayer insulation layer 170 may cover the first and second gate electrode 151 and 152 and the first and second impurity regions 121 and 124 on the substrate.

First and second contacts 181 and 182 are disposed on the first and second impurity regions through the interlayer insulation layer 170, respectively. That is, the first contact 181 is electrically connected to the first impurity region 121 and the second contact 182 is electrically connected to the second impurity region 124. Additionally, third and fourth contacts 183 and 184 are disposed on the second and first gate electrodes 152 and 151, respectively, through the interlayer insulation layer 170. That is, the third contact 183 is electrically connected to the second gate electrode 152 and the fourth contact 184 is electrically connected to the first gate electrode 151. Only one of each of the first contact 181 and the second contact 182 is illustrated in FIG. 1, but these contacts may be provided in plurality.

First to third wirings 191, 192, and 193 are disposed on the interlayer insulation layer 170. Each of the first to third wirings 191, 192, and 193 may be in a conductive pattern of a pad type or a line type. The first wiring 191 is electrically connected to the first contact 181, the second wiring 192 is electrically connected to the second contact 182 and the third contact 183, and the third wiring 193 is electrically connected to the fourth contact 184 (see FIG. 1). The second gate electrode 152 and the second impurity region 124 may be electrically connected to each other through the second wiring 192. Accordingly, a signal voltage may be simultaneously provided to the second gate electrode 152 and the second impurity region 124.

Figure 2B:
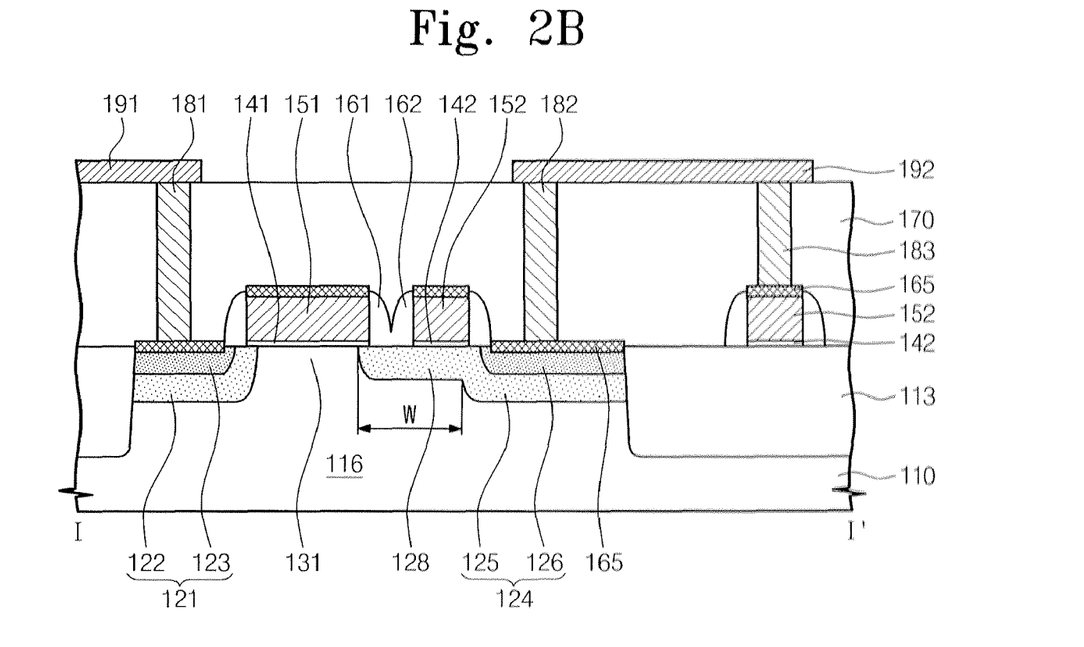

Referring to FIG. 2B, a signal voltage (e.g., a drain voltage) may be provided to the second wiring 192. Due to the signal voltage, the second low concentration region 125 of the second impurity region 124 may be electrically connected to the third impurity region 127 at the second channel region 132 of FIG. 2A below the second gate electrode 152. Accordingly, the low concentration region 128 extending from the second high concentration region 126 to one side of the first gate electrode 151 can be formed. A breakdown voltage of a high voltage transistor may be increased by the extended low concentration impurity region 128. That is, a breakdown voltage of a high voltage transistor may be increased in proportional to the width W of the extended low concentration impurity region 128.

Although the high voltage transistor includes the silicide layer on the first and second impurity regions 121 and 124 (i.e., source/drain regions), it has an increased breakdown voltage. Therefore, operating characteristics of the high voltage transistor can be improved.

Referring to FIGS. 3 through 8, a method of fabricating a high voltage transistor is described according to an embodiment of the present general inventive concept.

Figure 3:
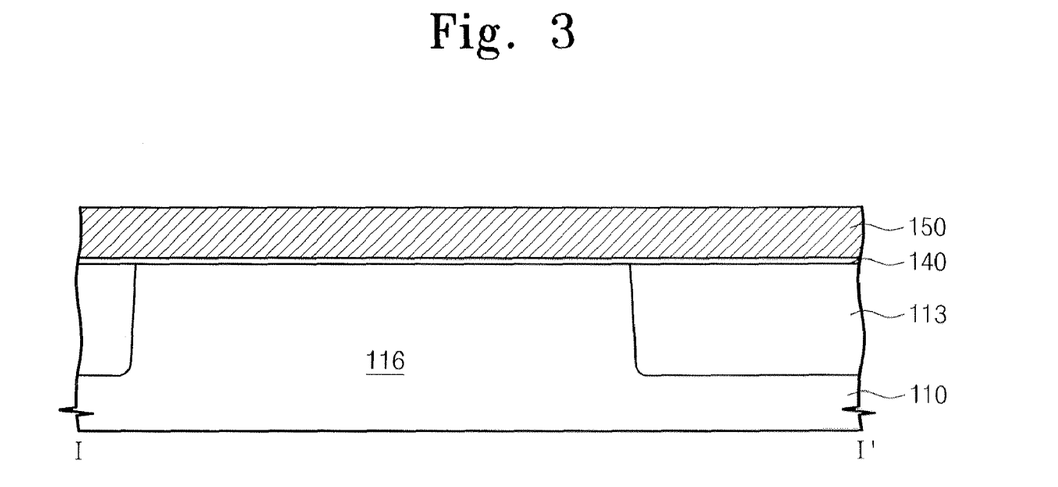
FIGS. 3 through 8 are cross sectional views taken along a line I-I' of FIG. 1 general inventive concept illustrating a method of fabricating a high voltage transistor according to an embodiment of the present general inventive concept.

Referring to FIG. 3, an isolation layer 113 defining an active region 116 is formed in a substrate 110. An insulation layer 140 and a conductive layer 150 are sequentially formed on the substrate 110. The insulation layer 140, for example, may be formed of a thermal oxide layer through a thermal oxide process, and the conductive layer 150 may be formed of a doped polysilicon layer through a CVD process.

Figure 4:
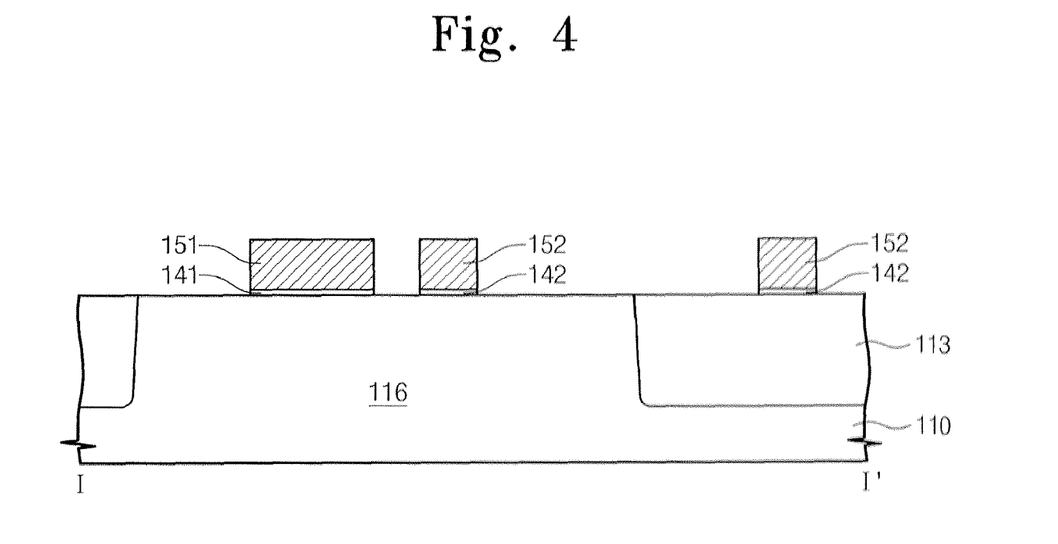

Referring to FIG. 4, the insulation layer 140 and the conductive layer 150 are patterned to form first and second gate insulation layers 141 and 142 and first and second gate electrodes 151 and 152, respectively. The first and second gate electrodes 151 and 152 may be formed to cross over the active region 116.

Figure 5:
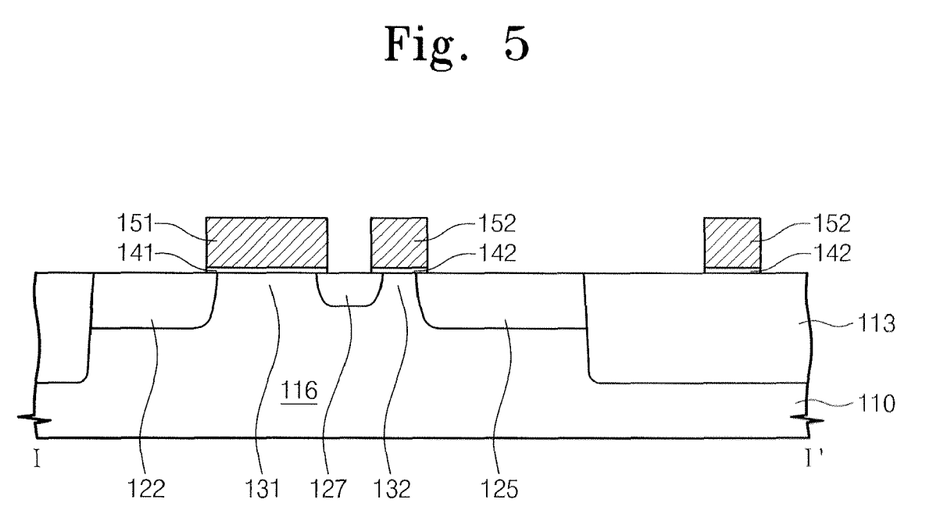

Referring to FIG. 5, a first low concentration region 122, a second low concentration region 125, and a third concentration region 127 are formed in the active region 116 through an ion implantation process. The first low concentration region 122, the second low concentration region 125, and the third concentration region 127 may be simultaneously formed by using the first and second gate electrodes 151 and 152 as an ion implantation mask or may be sequentially formed by using additional ion implantation masks. The third concentration region 127 may also be formed of a low concentration region. The first low concentration region 122 is formed in the active region 116 at one side of the first gate electrode 151 and the second low concentration region 125 is formed in the active region 116 at one side of the second gate electrode 152. The third concentration region 127 (impurity region) is formed in the active region 116 between the first gate electrode 151 and the second gate electrode 152.

Figure 6:
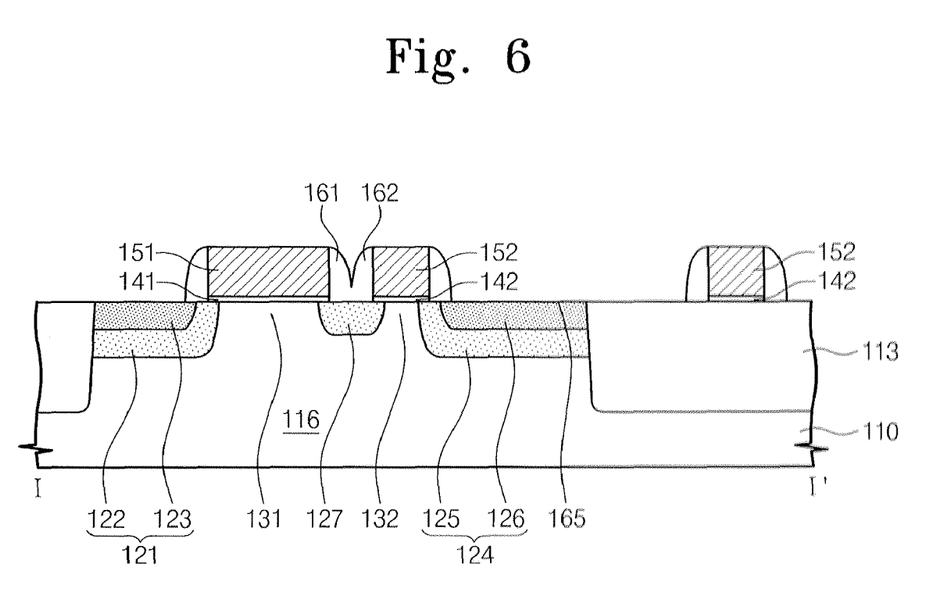

Referring to FIG. 6, first spacers 161 are formed on both sidewalls of the first gate electrode 151, and second spacers 162 are formed on both sidewalls of the second gate electrode 152. The first and second spacers 161 and 162 may be formed through a blanket anisotropic etch after forming an insulation layer (e.g., an oxide layer or a nitride layer) on the substrate 110 having the first and second gate electrode 151 and 152 through a CVD process. The first spacer 161 and the second spacer 162 are connected to each other between the first gate electrode 151 and the second gate electrode 152. Additionally, the first spacer 161 and the second spacer 162 that is disposed between the first and second gate electrodes 151 and 152 may completely cover the third concentration region 127 between the first and second gate electrode 151 and 152.

By using the first and second gate electrodes 151 and 152 and the first and second spacers 161 and 162 as an ion implantation mask, the first high concentration region 123 is formed in the first low concentration region 122, and the second high concentration region 126 is formed in the second low concentration region 125. Therefore, the first impurity region 121 including the first low concentration region 122 and the first high concentration region 123 and the second impurity region 124 including the second low concentration region 125 and the second high concentration region 126 are formed. Ions may not be implanted on the third impurity region 127 because the first spacer 161 and the second spacer 162 are connected to each other between the first and second gate electrodes 151 and 152 to form a mask. That is, the third impurity region 127 may not have a high concentration region.

Figure 7:
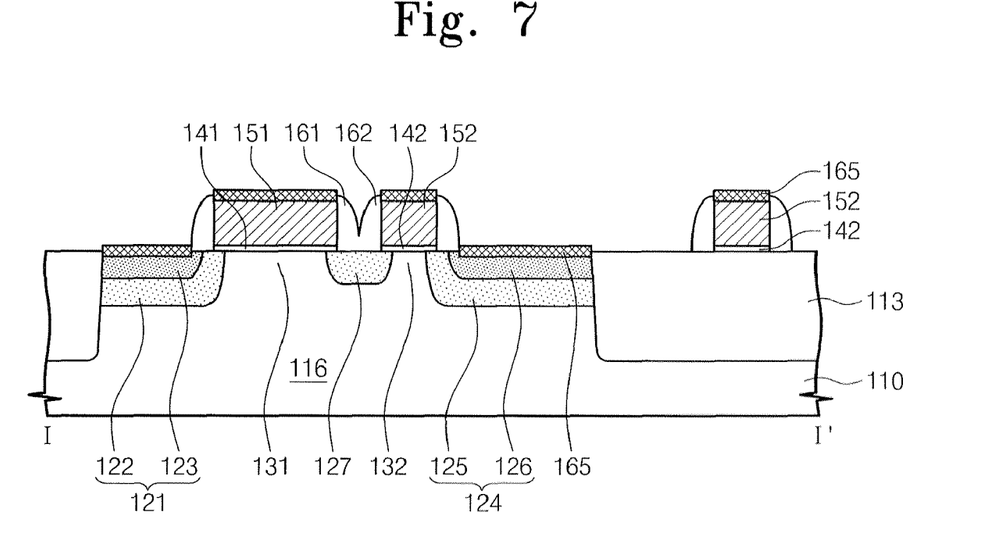

Referring to FIG. 7, a silicide layer 165 is formed on the first and second gate electrodes 151 and 152 and the first and second high concentration regions 123 and 126. The silicide layer 165 may be formed through a silicidation process after forming a metal layer on the substrate 110 having the first and second spacers 161 and 162. That is, due to the silicidation process, a portion of the metal layer contacting the first and second impurity regions 121 and 124 including silicon and the first and second gate electrodes 151 and 152 reacts to silicon such that the silicide layer 165 is formed. The metal layer may be formed of tungsten, nickel, cobalt, or titanium. After performing the silicidation process, an un-reacted portion among the metal layer is removed.

Figure 8:
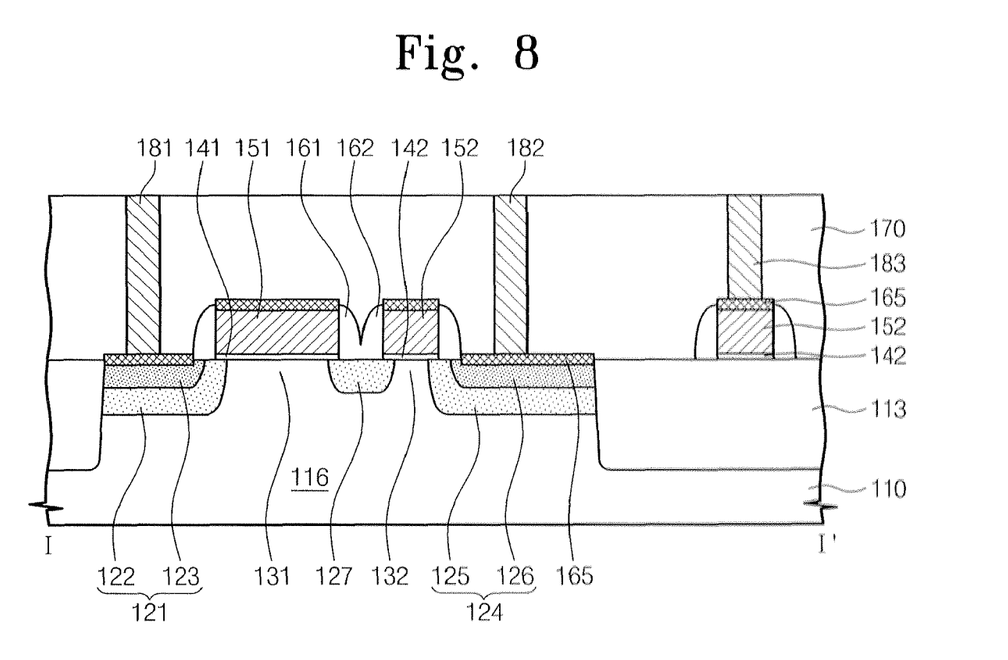

Referring to FIG. 8, an interlayer insulation layer 170 is formed on the substrate 110. The interlayer insulation layer 170, for example, may be formed of an oxide through a CVD process. A first contact 181, a second contact 182 and a third contact 183 electrically connected to the first impurity region 121, the second impurity region 124 and the second gate electrode respectively are formed, The first to third contacts 181, 182 and 183 may be formed to penetrate the interlayer insulation layer 170. The first to third contacts 181, 182, and 183 may be formed of a conductive material (e.g., a doped polysilicon or a metal) and may be simultaneously formed. Similarly, the fourth contact 184 may be formed, as illustrated in FIG. 1.

Referring back to FIG. 2A, after forming a conductive layer on the interlayer insulation layer 170 and then patterning the conductive layer, first and second wirings 191 and 192 are formed. The first wiring 191 is electrically connected to the first contact 181 and the second wiring 192 is electrically connected to the second and third contacts 182 and 183. Similarly, as illustrated in FIG. 1, the third wiring 193 may be formed to be electrically connected to the fourth contact 184.

According to embodiments of the present general inventive concept, a high voltage transistor can have an increased breakdown voltage. Additionally, the high voltage transistor can have a silicide layer on source/drain regions. Accordingly, reliability and operating characteristics of a high voltage transistor can be improved.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A high voltage transistor comprising:
 a substrate where an active region is defined;
 a first impurity region and a second impurity region in the active region and a third impurity region between the first and second impurity regions; and
 a first gate electrode on the active region between the first impurity region and the third impurity region and a second gate electrode on the active region between the second impurity region and the third impurity region,
 wherein the first impurity region comprises a first low concentration region and a first high concentration region in the first low concentration region, and the second impurity region comprises a second low concentration region and a second high concentration region in the second low concentration region,
 wherein a signal voltage is provided to the second gate electrode, and the second low concentration region end the third impurity region are electrically connected to each other through the signal voltage such that an extended low concentration impurity region is formed in the active region between the first gate electrode and the second impurity region.

2. The high voltage transistor of claim 1, wherein the second gate electrode and the second impurity region are electrically connected to each other.

3. The high voltage transistor of claim 1, wherein the third impurity region is a low concentration region similar to the first and second low concentration regions.

4. The high voltage transistor of claim 1, further comprising:
 an interlayer insulation layer covering the first and second gate electrodes on the substrate;
 a first contact connected electrically to the first impurity region through the interlayer insulation layer;
 a second contact connected electrically to the second impurity region through the interlayer insulation layer;
 a third contact connected electrically to the second gate electrode through the interlayer insulation layer; and
 a conductive pattern electrically connecting the second and third contacts on the interlayer insulation layer.

5. The high voltage transistor of claim 4, wherein a signal voltage is simultaneously provided to the second impurity region and the second gate electrode through the conductive pattern.

6. The high voltage transistor of claim 5, wherein the second low concentration region and the third impurity region are electrically connected to each other through the signal voltage such that an extended low concentration region is formed in the active region between the first gate electrode and the second impurity region.

7. The high voltage transistor of claim 1, further comprising:
 a silicide layer on the first impurity region, the second impurity region, the first gate electrode, and the second gate electrode.

8. The high voltage transistor of claim 1, further comprising:
 first spacers on both sidewalls of the first gate electrode and second spacers on both sidewalls of the second gate electrode, wherein the first spacer and the second spacer are connected to each other between the first and second gate electrodes.

9. The high voltage transistor of claim 8, wherein the first spacer and the second spacer between the first and second gate electrodes completely cover the third impurity region between the first and second gate electrodes.

10. A semiconductor device forming a high voltage transistor, comprising:
 a substrate including an active region;
 a first gate electrode and a second gate electrode disposed over the active region and separated by spacers;
 a first impurity region having a double diffused drain (DDD) structure disposed in the active region below the first gate electrode, a second impurity region having a double diffused drain (DDD) structure disposed in the active region below the first gate electrode and a third impurity region having a low concentration disposed in the active region between the first and second gate electrodes such that first and second channels are formed below the first and second gate electrodes, respectively; and
 an electrical contact connecting the second impurity region with the second gate electrode such that a low concentration region of the second impurity region and the third impurity region become one extended low concentration region when a signal voltage is applied to the electrical contact.

11. The semiconductor device of claim 10, wherein a breakdown voltage of the high voltage transistor is increased in proportion to a width of the extended low concentration region.

12. The semiconductor device of claim 11, wherein the first and second impurity regions include a silicide layer formed thereon.

13. The semiconductor device of claim 10, wherein the first and second spacers disposed between the first and second gate electrodes completely cover the third impurity region.

14. A method of forming a high voltage transistor of a semiconductor device, comprising:
 forming an isolation layer defining an active region in a substrate;
 sequentially forming an insulation layer and a conductive layer on the substrate;
 patterning the insulation layer and the conductive layer to form first and second gate insulation layer and first and second gate electrodes, respectively, the first and second gate electrodes formed to cross over the action region;

forming a first low concentration region, a second low concentration region and a third concentration region in the active region;

forming first spacers on sidewalls of the first gate electrode and second spacers on sidewalls of the second gate electrode such that the first and second spacers are connected between the first and second gate electrode;

forming a first high concentration region in the first low concentration region and a second high concentration region in the second low concentration region using the first and second gates and first and second spacers as ion implantation masks;

forming a silicide layer on the first and second gate electrodes and the first and second high concentration regions;

forming an insulation layer on the substrate;

forming a first contact through the insulation layer to electrically connect with the first impurity region, a second contact through the insulation layer to electrically connect with the second impurity region and a third contact through the insulation layer to electrically connect with the second gate electrode; and forming a first wiring to be electrically connected to the first contact and the second wiring to be electrically connected between the second and third contacts, wherein a signal voltage is provided to the second gate electrode, and the second low concentration region and the third concentration region are electrically connected to each other through the signal voltage such that an extended low concentration impurity region is formed in the active region between the first gate electrode and the second low concentration impurity region.

15. The method of claim 14, wherein the first and second low concentration regions and the third concentration region are formed simultaneously via an ion implantation process using the first and second gate electrodes as an ion implantation mask.

16. The method of claim 15, wherein the third concentration region is formed to be a low concentration region.

17. The method of claim 14, wherein the silicide layer is formed through a silicidation process after forming a metal layer on the substrate having the first and second spacers formed thereon.

18. The method of claim 17, wherein the first and second spacers are formed through a blanket anisotropic etch after forming an insulation layer on the substrate having the first and second gate electrodes through a CVD process.

* * * * *